United States Patent [19]
Kato

[11] 3,980,896
[45] Sept. 14, 1976

[54] INTEGRATED CIRCUIT DEVICE

[75] Inventor: Mitsuharu Kato, Aichi, Japan

[73] Assignee: Nippondenso Co., Ltd., Kariya, Japan

[22] Filed: Apr. 9, 1975

[21] Appl. No.: 566,322

[30] Foreign Application Priority Data
Apr. 10, 1974  Japan.............................. 49-41252

[52] U.S. Cl................................ 307/205; 307/214; 307/215; 331/57
[51] Int. Cl.²................. H03K 19/08; H03K 19/20; H03B 5/04
[58] Field of Search.......... 307/205, 214, 215, 304; 331/57

[56] References Cited
UNITED STATES PATENTS
3,700,981  10/1972  Masuhara et al. .............. 307/205 X OTHER PUBLICATIONS
Moore, "MOS Transistor Current Switch"; *IBM Tech. Discl. Bull.*; vol. 9, No. 6, pp. 698–9; 11/1966.
Lohman, "Applications of MOSFETs in Microelectronics"; *SCP and Solid-State Technology* (pub.); pp. 23–29; 3/1966.
Nat'l Semiconductor Corp. (pub.); 10/1968; "MM480/MM580 dual MOS three-input NOR gate"; 4 pages.

*Primary Examiner*—John S. Heyman
*Assistant Examiner*—Larry N. Anagnos
*Attorney, Agent, or Firm*—Cushman, Darby & Cushman

[57] ABSTRACT

In an integrated circuit device with a propagation delay time almost independent of the fluctuation of the quality of the gate oxide layer and the fluctuation of power source voltage, a MOS logic element comprises a driving MOS transistor circuit including a p-channel or an n-channel enhancement type MOS transistor for a switching operation, and a load MOS transistor circuit, connected to said enhancement type MOS transistor and including an n-channel or a p-channel depletion type MOS transistor with a threshold voltage about two times higher than that of said enhancement type MOS transistor, for operating as a load of said driving MOS transistor circuit.

10 Claims, 7 Drawing Figures

INTEGRATED CIRCUIT DEVICE

BACKGROUND OF THE INVENTION

In general, two kinds of MOS semiconductor devices (an integrated circuit provided with MOS semiconductors) are known, that is a complementary MOS semiconductor device (hereinafter referred to as a C-MOS device) and a E/D type p-channel MOS semiconductor device (hereinafter referred to as an E/D p-MOS device). In the C-MOS device, "0" propagation delay time $t_{pdo}$ and "1" propagation delay time $t_{pd1}$ are shown respectively by the following expressions:

$$t_{pdo} \propto (\beta_N/2)(V_{DD} - V_{TN})^2 \text{ and } t_{pd1} \propto (\beta_p/2)(V_{DD} - V_{TP})^2$$

Where $V_{TN}$ and $V_{TP}$ are threshold voltages of a n-channel MOS transistor and a p-channel MOS transistor respectively, and $\beta_N$ and $\beta_p$ are size parameters represented by the following equations.

$$\beta_N = \frac{\mu_N \epsilon_{ox}}{t_{ox}} \left( \frac{W_N}{L_N} \right) \quad \beta_p = \frac{\mu_p \epsilon_{ox}}{t_{ox}} \left( \frac{W_p}{L_p} \right) \quad (1)$$

where $\mu_N$, $\mu_p$ are carrier mobilities of n-channel MOS transistor and p-channel MOS transistor, respectively, $W_N/L_N$, $W_p/L_p$ are channel width-channel length ratio of n-channel MOS transistor and that of p-channel MOS transistor, respectively, $\epsilon_{ox}$ is gate oxide layer inductivity, and $t_{ox}$ is thickness of the gate oxide layer.

Thus, the propagation delay time of the C-MOS device depends on the fluctuation of power source voltage $V_{DD}$, which is a defect of the C-MOS device.

On the other hand, "1" propagation delay time of the E/D p-MOS device is shown by the following equation (2).

$$t_{pd1} = \frac{2C}{\beta p} \cdot \frac{|V_{TD}|}{|V_{TL}|^2} \quad (2)$$

where
  $C$ = whole output capacity of E/D p-MOS device,
  $V_{TD}$ = negative threshold voltage of the driving MOS transistor,
  $V_{TL}$ = threshold voltage of the load MOS transistor.

"0" propagation delay time of the E/D p-MOS device $t_{pdo}$ may be negligible since it is sufficiently small compared with the "1" propagation delay time $t_{pd1}$.

It is noted that the propagation delay time $t_{pd1}$ of the E/D p-MOS device does not depend on power source voltage, but depends on threshold voltage. If a change arises in the quality of the gate oxide layer $Q_{ss}$ by the amount of $\Delta Q_{ss}$ during a manufacturing process, a change arises in the threshold voltages $V_{TD}$ and $V_{TL}$ by the amount of $(t_{ox}/\epsilon_{ox})\Delta Q_{ss}$, whereby the threshold voltage $V_{TD}$ and $V_{TL}$ change to $V_{TD} + (t_{ox}/\epsilon_{ox})\Delta Q_{ss}$ and $V_{TL} - (t_{ox}/\epsilon_{ox})\Delta Q_{ss}$ respectively. Substitution of these values into equation (2) gives the following equation (3):

$$t_{pd1} \doteq \frac{2C}{\beta_p} \cdot \frac{V_{TD}}{V^2_{TL}} \left\{ 1 + \left( \frac{1}{V_{TD}} + \frac{2}{V_{TL}} \right) \frac{t_{ox}}{\epsilon_{ox}} \Delta Q_{ss} \right\} \quad (3)$$

The equation (3) shows that the "1" propagation delay time of the E/D p-MOS device changes greatly in accordance with the change $\Delta Q_{ss}$, that is, the "1" propagation delay time $t_{pd1}$ of the E/D p-MOS device depends on the quality of the gate oxide layer, which is a defect of the E/D p-MOS device.

SUMMARY OF THE INVENTION

An object of the present invention is to provide an integrated circuit device the propagation delay time of which hardly changes even if the change of the quality of the gate oxide layer occurs, whereby the manufacturing process control can be made easier.

Another object of the present invention is to provide an integrated circuit device, the propagation delay time of which hardly changes even if the fluctuation of power source voltage occurs.

Further object of the present invention is to provide an integrated circuit device which operates as a ring oscillator with a stable oscillating frequency unaffected by the fluctuation of power source voltage and the change of the quality of the gate oxide layer produced in the manufacturing process.

Still further object of the present invention is to provide an integrated circuit device which operates as a ring oscillator with a stable oscillating frequency unaffected by the size of the load capacity.

DESCRIPTION OF THE PREFERRED EMBODIMENT

Figure 1:
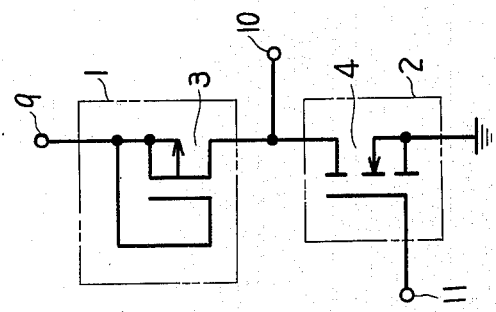
FIG. 1 is an electric circuit diagram for an inverter element, which embodies the MOS logic element employed in the present invention.

The present invention will now be described with reference to the attached drawings. An inverter element of the present invention is shown in FIG. 1, wherein a load MOS transistor circuit 1 is composed of a p-channel depletion type MOS transistor 3, and a driving MOS transistor circuit 2 is composed of an n-channel enhancement type MOS transistor 4. A combination of the load MOS transistor circuit 1 and the driving MOS transistor circuit 2 is called a MOS logic element. The gate of the p-channel depletion type MOS transistor 3 is short-circuited to the terminal 9 to which positive power source voltage is applied. The drain of the p-channel depletion type MOS transistor 3 is connected to the drain of the n-channel enhancement type MOS transistor 4. The source of the n-channel enhancement type MOS transistor 4 is connected to the ground, and the terminal 11 of the n-channel enhancement type MOS transistor 4 receives an input signal. The inverter element inverts the input signal applied to the terminal 11, and generates an output signal at the terminal 10.

Figure 2:
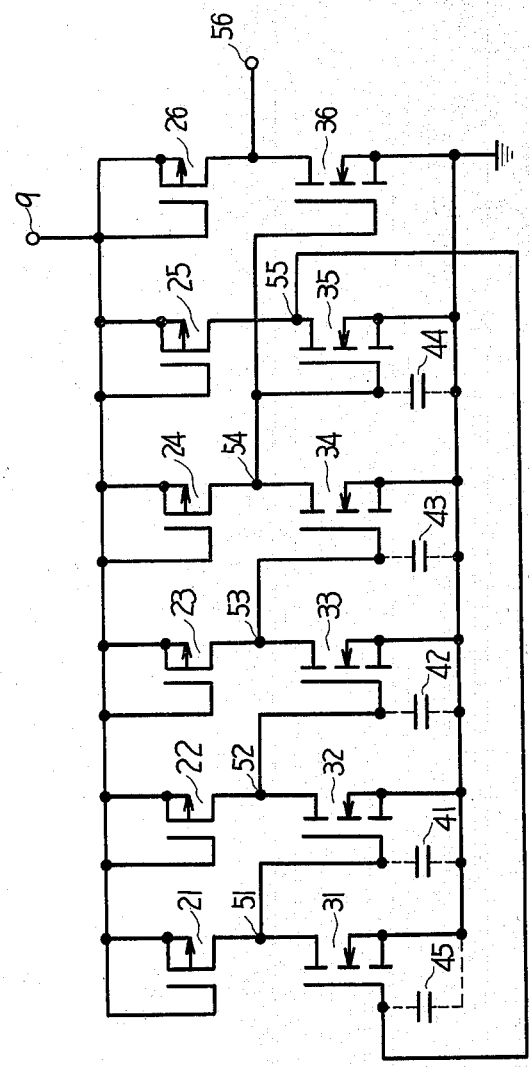
FIG. 2 is an electric circuit diagram of a ring oscillator showing an embodiment of the present invention.

FIG. 2 shows a ring oscillator composed of the inverters shown in FIG. 1. In FIG. 2, numerals 21, 22, 23, 24, 25 and 26 designate the first, second, third, fourth, fifth and output stage p-channel depletion type MOS transistors, respectively. Numerals 31, 32, 33, 34, 35 and 36 designate the first, second, third, fourth, fifth and output stage n-channel enhancement type MOS transistors, respectively. Numerals 41, 42, 43, 44 and 45 designate the capacitors existing at the output side of the first, second, third, fourth, and fifth stage n-channel enhancement type MOS transistor, respectively. The p-channel depletion type MOS transistor 21 and the n-channel enhancement type MOS transistor 31 form an inverter element, similarly, each couple of the p-channel depletion type MOS transistors and the n-channel enhancement type MOS transistors bearing the same stage number disposed side by side forms an inverter. In FIG. 2, five inverters from the first to the fifth stage are connected in series and the terminal 55 of the fifth stage inverter is connected to the input side of the first stage inverter, forming an oscillation circuit, and the output stage inverter composed of the p-channel depletion type MOS transistor 26 and the n-channel enhancement type MOS transistor 36 constitute an output buffer circuit, which provides an output signal at the terminal 56 without disturbing the oscillating frequency. Each of the terminals 51, 52, 53, 54, 55 and 56 of the inverters develops each output signal.

Figure 3:
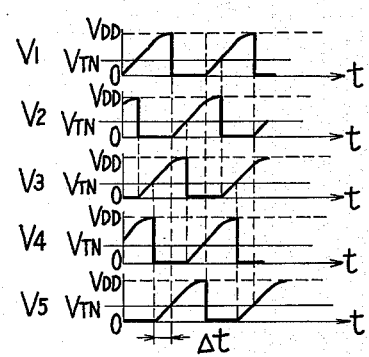
FIG. 3 are wave form diagrams illustrating the voltage developing in the electric circuit shown in FIG. 2.

The operation of the ring oscillator with the construction described above of the present invention will now be explained. Output voltages $V_1$, $V_2$, $V_3$, $V_4$ and $V_5$ are generated at the terminals 51, 52, 53, 54 and 55 with the lapse of time as shown in FIG. 3. If the output voltage $V_5$ appearing at the terminal 55 of the fifth stage inverter is 0, the first stage n-channel enhancement type MOS transistor 31 becomes non-conductive, whereby the capacitor 41 begins to be charged through the p-channel depletion type MOS transistor 21. The output voltage $V_1$ produced at the terminal 51 rises in accordance with the progress of charging of the capacitor 41 and gradually approaches the threshold voltage $V_{TN}$ of the n-channel enhancement type MOS transistor 32 of the second stage. As soon as the output voltage $V_1$ reaches the threshold voltage $V_{TN}$, the n-channel enhancement type MOS transistor 32 changes its state from non-conductive to conductive and the output voltage $V_2$ at the terminal 52 becomes 0 which, in turn, renders the n-channel enhancement type MOS transistor 33 to be non-conductive. Therefore, the capacitor 43 begins to be charged through the p-channel depletion type MOS transistor 23 causing the rise of the output voltage $V_3$. Repeating the same operation described above, oscillation begins with the oscillation frequency $f$ determined by the equation $f = 1/5\Delta t$, where $\Delta t$ is a propagation delay time, that is, a time period necessary for the output voltage to rise from 0 to threshold voltage in accordance with the charging of the capacitor, which is shown by the following equation (4):

$$\Delta t = \frac{2c}{\beta_p} \frac{V_{TN}}{V_{TP}^2} \qquad (4)$$

where $c$ is an output capacity of each inverter, $\beta_p$ is a size parameter of the p-channel depletion type MOS transistor shown in equation (1), $V_{TP}$ is a positive threshold voltage of the p-channel depletion type MOS transistor, and $V_{TN}$ is a positive threshold voltage of the n-channel enhancement type MOS transistor.

When the change in the quality of the gate oxide layer $\Delta Q_{ss}$ occurs during the manufacturing process, the threshold voltages $V_{TP}$ and $V_{TN}$ change to $$V_{TP} - \frac{t_{ox}}{\epsilon_{ox}} \Delta Q_{ss} \text{ and } V_{TN} - \frac{t_{ox}}{\epsilon_{ox}} \Delta Q_{ss},$$

respectively. Substitution of these values into the equation (4) gives the following equation (5) for the new expression of the propagation delay time $\Delta t$.

$$\Delta t \doteq \frac{2c}{\beta_p} \frac{V_{TN}}{V_{TP}^2} \left\{ 1 - \left( \frac{1}{V_{TN}} - \frac{2}{V_{TP}} \right) \frac{t_{ox}}{\epsilon_{ox}} \Delta Q_{ss} \right\} \qquad (5)$$

It is noted that the propagation delay time of the MOS logic element is independent of the change in the quality of the gate oxide layer $\Delta Q_{ss}$ if $V_{TP}$ is $2V_{TN}$.

Figure 4:
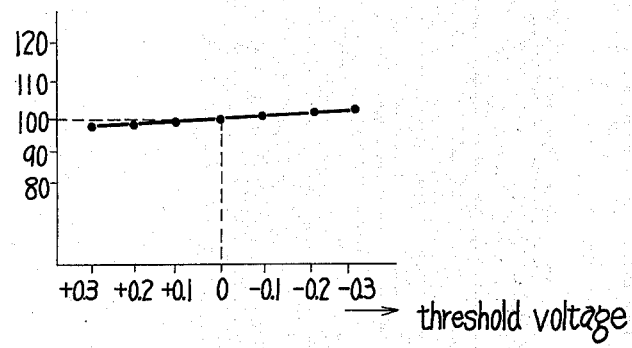
FIG. 4 and FIG. 5 are characteristic diagrams representing the characteristic of the inverter constituting the ring oscillator shown in FIG. 2.
Figure 5:
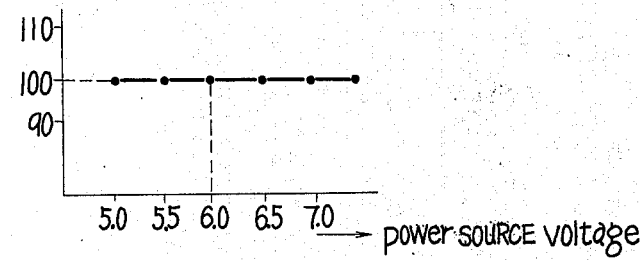

FIG. 4 and FIG. 5 show the characteristic curves of the propagation delay time of the ring oscillator shown in FIG. 2 under the condition $V_{TN} = 1.5V$, $V_{TP} = 3V$. Each datum in FIGS. 4 and 5 is calculated from the measured values of the frequency of the ring oscillator using the relation $\Delta t = 1/5f$. The ordinate and the abscissa in FIG. 4 represent normalized value of the propagation delay time and threshold voltage, respectively. The ordinate and the abscissa in FIG. 5 represent the normalized value of the propagation delay time and power source voltage, respectively. Since the gate and the source of the p-channel depletion type MOS transistor are connected in common to constitute a constant-current source, it is reasonable that the propagation delay time of the present invention becomes independent of the power source voltage shown in FIG. 5. Further the driving MOS transistor circuit is composed of the enhancement type MOS transistor the polarity of which is opposite to the depletion type MOS transistor, and the threshold voltage of the enhancement type MOS transistor is about a half of that of the depletion type MOS transistor. Therefore, the change of the propagation delay time due to the change in the quality of the gate oxide layer becomes very small. For example, in the conventional E/D p-channel MOS inverter, the propagation delay time changes by 10% when the threshold voltage changes by 0.1V due to the change of the quality of the gate oxide layer, while the propagation delay time of the present invention changes less than 1% under the same condition as shown in FIG. 4.

Figure 6:
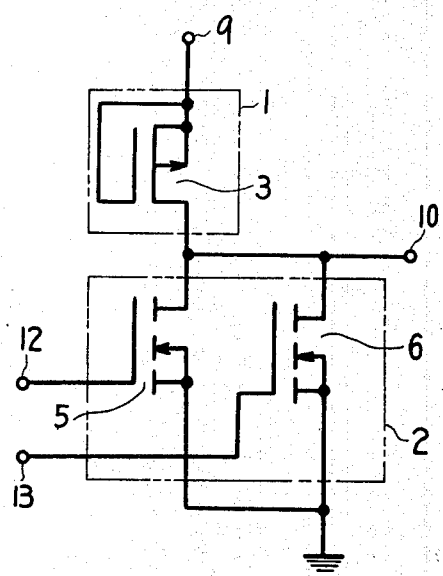
FIG. 6 and FIG. 7 are respectively, electric circuit diagrams for a NOR element and a NAND element of the present invention.
Figure 7:
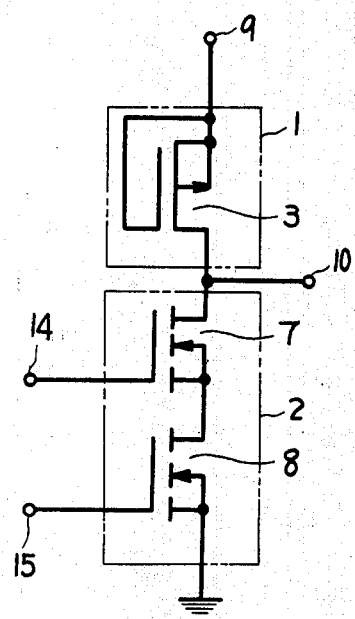

While the MOS logic element of the ring oscillator described above is composed of the basic type inverter element, it is of course possible for the integrated circuit device of the present invention to employ the MOS logic element composed of the general basic elements such as NAND element, NOR element and flip-flop element. Naturally the characteristic of the propagation delay time is improved in this case. FIG. 6 shows the NOR element, the driving MOS transistor circuit 2 of which is composed of two n-channel enhancement type MOS transistors 5, 6 connected in parallel. The NOR element receives input signals at the terminals 12 and 13 and generates an output signal at the terminal 10. FIG. 7 shows the NAND element, the driving MOS transistor circuit 2 of which is composed of two n-channel enhancement type MOS transistor 7, 8 connected in series. In this element, input signals are applied to the terminals 14 and 15 and the output signal is drawn out from the terminal 10.

It is still possible for the present invention to form the load MOS transistor circuit and the driving MOS transistor circuit in the combination with an n-channel depletion type MOS transistor and a p-channel enhancement type MOS transistor, respectively.

What is claimed is:

1. An integrated circuit device including a MOS logic element in combination with a power source, wherein said MOS logic element comprises:
    a driving MOS transistor circuit including an enhancement type MOS transistor of a specific polarity, and
    a load MOS transistor circuit connected to said enhancement type MOS transistor and including a depletion type MOS transistor having its polarity opposite to that of said enhancement type MOS transistor with a threshold voltage about two times higher than that of said enhancement type MOS transistor.

2. An integrated circuit device as claimed in claim 1, wherein an odd number of inverters each of which comprises said MOS logic element are connected in series with an output terminal of said MOS logic element in the last stage connected to an input terminal of said MOS logic element in the first stage, thereby forming an oscillation circuit.

3. An integrated circuit device as claimed in claim 2, wherein a gate and a source of said depletion type MOS transistor are both connected to said power source and a drain thereof is connected to said driving MOS transistor circuit.

4. An integrated circuit device as claimed in claim 2, wherein a drain of said enhancement type MOS transistor is connected to said load MOS transistor circuit, a source thereof is connected to the ground potential and a gate thereof is constructed to receive an input signal.

5. An integrated circuit device as claimed in claim 2 further comprising:
    an output buffer circuit connected to said oscillation circuit for generating an output signal to be applied to a load in accordance with the output signal from said oscillation circuit, said buffer circuit effectively isolating said oscillation circuit from said load.

6. An integrated circuit device as claimed in claim 5 wherein said output buffer circuit comprises said MOS logic element.

7. An integrated circuit device as claimed in claim 1, wherein a gate and a source of said depletion type MOS transistor are both connected to said power source and a drain thereof is connected to said driving MOS transistor circuit.

8. An integrated circuit device as claimed in claim 1, wherein a drain of said enhancement type MOS transistor is connected to said load MOS transistor circuit, a source thereof is connected to the ground potential and a gate thereof is constructed to receive an input signal.

9. An integrated circuit device as claimed in claim 1, wherein said driving MOS transistor circuit comprises:
    a first and second enhancement type MOS transistors, both drains of which are connected to the same portion of said load MOS transistor circuit, and both sources of which are connected to the ground potential, and each gate of which is constructed to receive an input signal.

10. An integrated circuit device as claimed in claim 1, wherein said driving MOS transistor circuit comprises:
    a first enhancement type MOS transistor a drain of which is connected to said load MOS transistor circuit and a gate of which is constructed to receive an input signal, and
    a second enhancement type MOS transistor a drain of which is connected to a source of said first enhancement type MOS transistor and a source of which is connected to the ground potential and a gate of which is constructed to receive an input signal.

* * * * *